United States Patent [19]

Gammel

[11] 3,899,746

[45] Aug. 12, 1975

[54] TWO OSCILLATORS ALTERNATELY SWITCHED INTO A PHASE LOCK LOOP WITH OUTPUTS TAKEN ONLY DURING FREE RUNNING PERIOD OF EACH OSCILLATOR

[75] Inventor: Josef Engelbert Gammel, Munich, Germany

[73] Assignee: Siemens Aktiengesellschaft, Berlin & Munich, Germany

[22] Filed: Sept. 14, 1973

[21] Appl. No.: 397,401

[30] Foreign Application Priority Data

Sept. 22, 1972 Germany .......... 2246487

[52] U.S. Cl. .......... 331/2; 331/14; 331/49; 331/179

[51] Int. Cl. .......... H03b 3/04

[58] Field of Search .......... 331/2, 14, 49, 179

[56] References Cited

UNITED STATES PATENTS

| | | | |
|---|---|---|---|
| 3,348,164 | 10/1967 | Brunins | 331/2 |
| 3,729,688 | 4/1973 | Cerny et al. | 331/179 X |

*Primary Examiner*—Siegfried H. Grimm
*Attorney, Agent, or Firm*—Hill, Gross, Simpson, Van Santen, Steadman, Chiara & Simpson

[57] ABSTRACT

A stabilized oscillator circuit having two controlled oscillator stages with switching means for periodically switching from the output of one oscillator stage to the output of the other oscillator stage. Each of the controlled oscillator stages are stable within predetermined limits for a given period when free-running and stabilized from a reference oscillator circuit for a terminal part of the time that the other controlled oscillator is effective. Stabilization is effected by a phase discriminator which compares the output of the reference oscillator with a reduced component of the output from the controlled oscillator stage.

The arrangement may also employ individual oscillator stages operated at the same operating frequency. This makes it possible to generate an oscillation practically free of subsidiary waves, even over a long period of time. As the term "subsidiary waves" is herein used, it does not refer to multiples or harmonics of the oscillating frequency, but rather to interfering frequency components which result from the frequency preparation process during stabilization and control setting.

7 Claims, 6 Drawing Figures

TWO OSCILLATORS ALTERNATELY SWITCHED INTO A PHASE LOCK LOOP WITH OUTPUTS TAKEN ONLY DURING FREE RUNNING PERIOD OF EACH OSCILLATOR

FIELD OF THE INVENTION

The invention relates to stabilized oscillator circuit arrangements, especially for ultra high or very high frequency electromagnetic waves.

It is known to provide for the oscillating frequency of such circuits to be periodically switched over between at least two different frequency values, and to provide a frequency stabilization circuit in such manner that by means of an adjustable frequency reduction circuit such as a frequency divider circuit and/or a frequency converter circuit, the oscillating frequency is reduced to the value of a comparison frequency and compared with the latter in a phase discriminator which supplies a control value for frequency adjustment and frequency stabilization of the oscillation circuit arrangement.

Oscillator circuit arrangements of this type are required, for example, in order to be able to carry out a rapid change in the operating frequencies in a radio system. In this case an arrangement serves in a transmitter as a control generator, and serve in a receiver at the station as a heterodyne oscillator for received signals. These stabilized oscillator circuit arrangements are frequently referred to by the technical term "synthesizers," and are described, for example, in the following publications:

A. "Elektrisches Nachrichtenwesen," Vol. 45, No. 1, 1970 pages 19 to 23;

B. "Frequenz," Vol. 14/1960, No. 10, pages 335 to 343; and

C. "Telecommunications," July 1970, pages 17 to 19.

A difficulty which arises in stabilized oscillator circuit arrangements of this kind is the question of controlling subsidiary waves, i.e., not harmonics, but interfering frequency components which result from the frequency preparation process, and this is due to the injection via the frequency reduction circuit of the subsidiary waves which act as interferences, and reach the oscillator output, even though their amplitude is considerably less than that of the actual controlled oscillator stage. This phenomenon becomes particularly manifest when a rapid change of frequency is to be carried out in such a stabilized oscillator circuit arrangement.

BRIEF SUMMARY OF THE INVENTION

An object of the present invention is to provide an arrangement which substantially overcomes the above referred to disadvantage of prior art circuits.

The present invention consists in providing a stabilized oscillator circuit arrangement in which two controlled oscillator stages are provided, in which switching means periodically switch from the output of one to the output of the other, and in which each said controlled oscillator stage is stable within predetermined limits for a given period when free-running, and stabilized from a reference oscillator circuit for a terminal part of the time that the other of said controlled oscillator is effective, stabilization being effected by a phase discriminator which compares the output of the reference oscillator with a reduced frequency component of the output from said controlled oscillator stage.

The circuit arrangement may also be employed with advantage where the individual oscillator stages are to operate at the same oscillating frequency, as a result of which it is possible to generate an oscillation practically free of subsidiary waves even over a long period of time. As stated before, the term "subsidiary waves" is not to be understood as multiples or harmonics of the oscillating frequency, but as interfering frequency components which result from the frequency preparation process during stabilization and control setting. The term "subsidiary waves for synthesizers" is generally known under this definition. The use of two stages, with a common frequency, means that two or more oscillators may be set by means of a common frequency stabilization circuit to operate at the same frequency, and be alternately connected via a switch-over device to the frequency reduction circuit of the frequency stabilization circuit, both oscillators being connected to the output of the oscillation generating system via a switching device which instigates a transition from the one oscillator to the other, which transition takes place so slowly that any interference phase modulation produced by the transition process remains below a given value, during this transition period both oscillators being disconnected from the frequency stabilization circuit.

The invention takes advantage of the fact that free-running oscillators may generally be produced quite readily to give relatively high frequency stability for a short term, even when they possess automatic frequency adjusting devices. For example, conventional oscillator circuits with coils and inductances possess a frequency stability which is better than $10^{-7}$ to $10^{-8}$ over a period from a few seconds to as much as several minutes, and thus fully correspond to a quartz crystal stabilized reference oscillator in terms of frequency accuracy for a short term. Only over longer operating periods do the interfering influences of temperature, any damp in the environment, eventual aging of components, possible fluctuations in operating voltage, or like disturbing phenomena become manifest in free-running oscillators of this type. By disconnecting an oscillator of this type from the frequency stabilization circuit, the oscillator can be relied upon to possess its high frequency stability for a short period of time, for example, for up to a few seconds, but is free from the subsidiary waves which arise from the action of a frequency stabilization circuit. Consequently, a frequency stabilization which is displaced in terms of time from the periods of connection of the oscillator stage to the output of the stabilized oscillator circuit arrangement enables the arrangement to be operated free of subsidiary waves while maintaining a high level of frequency stability.

This arrangement is particularly suitable for a radio system operated with a frequency jump process, as is currently the case in many radio systems. However, as already stated, this method may also be applied in which radiation is carried out at only one frequency.

BRIEF DESCRIPTION OF THE DRAWINGS

The invention will now be described with reference to the drawings, in which.

DETAILED DESCRIPTION

Figures 1, 2, 3:
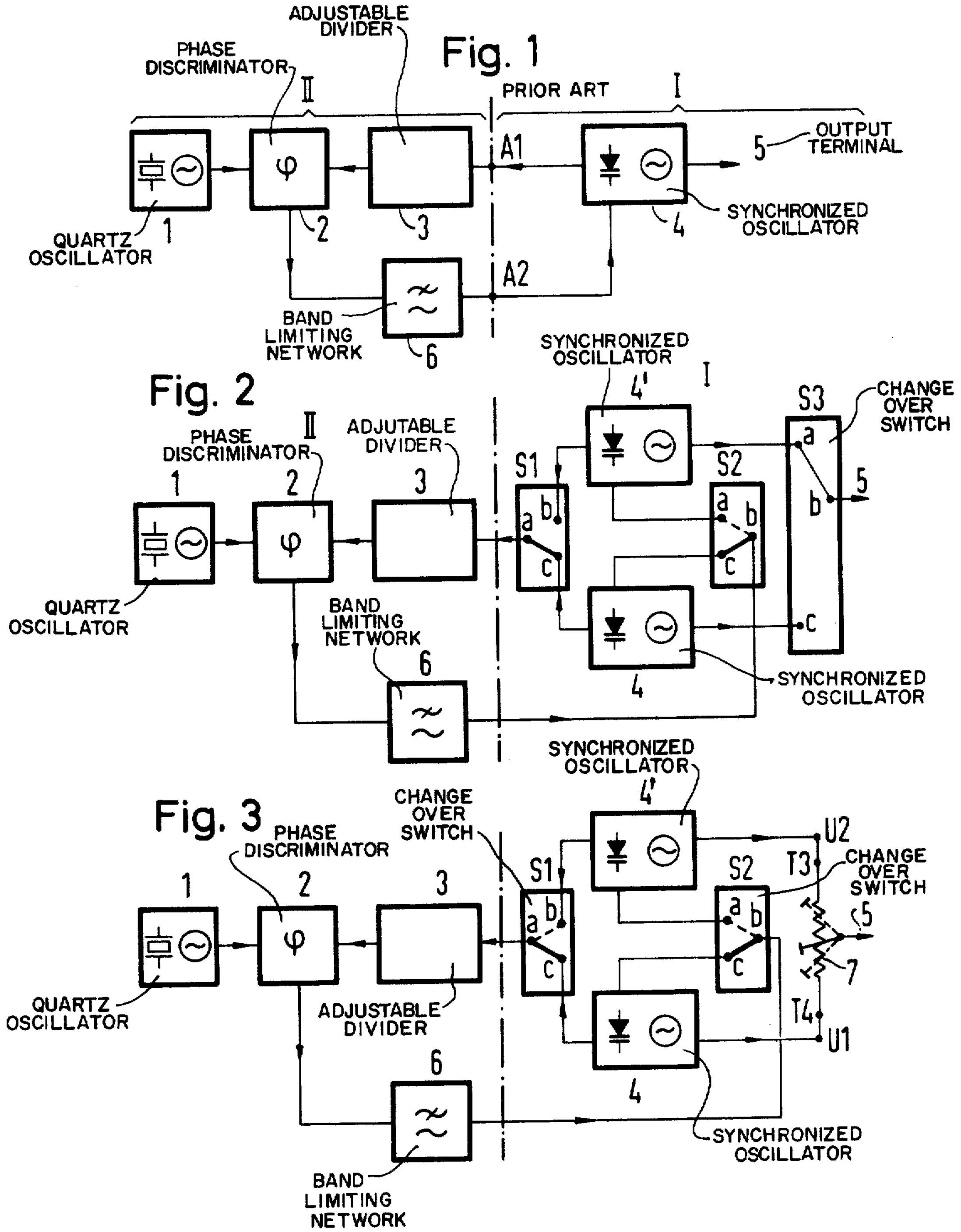
FIG. 1 schematically illustrates a basic arrangement of known type, in which a controlled oscillator stage I is stabilized by means of a reference oscillator in the form of a digital section II.
FIG. 2 is a block schematic circuit diagram of one exemplary embodiment in accordance with the invention, in which two oscillators of different frequencies are synchronized.
FIG. 3 is a block schematic circuit diagram of another exemplary embodiment of the invention for the operation of two oscillator stages working at the same frequency.

The prior art circuit arrangement shown in FIG. 1 comprises a crystal controlled reference oscillator 1 for the generation of a stable frequency which is fed to a phase discriminator 2, which also receives via an adjustable divider 3 a reduced frequency component of the output of a synchronized oscillator stage 4 which provides frequency stabilized oscillations at an output terminal 5, the phase discriminator 2 having its output connected to the oscillator stage 4 via a band limiting network 6.

The discriminator 2 thus controls the setting of the oscillator 4 and its action may cause disturbances.

Synthesizers frequently involve the problem that a rapid frequency change must be carried out, e.g., in accordance with a predetermined plan.

In respect of this problem, in an exemplary embodiment of the present invention, such as that shown in FIG. 2, the frequency stabilization is basically carried out in the manner described with reference to FIG. 1, except that two oscillator stages, 4 and 4' are alternately stabilized in their frequency by the selective operation of change over switches S1 and S2 which respectively connect the digital section (adjustable or fixed frequency divider II) to the input and output of the oscillator stages, the division ratio $n$ of the adjustable divider 3 being set to a first value $n_1$ in the time phase of the frequency stabilization of the oscillator 4, e.g., for the operating frequency f1, and to a second value $n_2$ in the time phase of the frequency stabilization of the oscillator 4', e.g., for the operating frequency $f2$. It will be appreciated that it is also possible for the divider 3 to be replaced by a frequency converter or mixer stage to which is connected the output from an oscillation source exhibiting appropriate frequency stability.

When rapid frequency changes are required, as for example, in communications systems in which it is necessary to alter the operating frequencies within a very short period of time, for example within <1 msec over large frequency ranges of up to one octave and more in accordance with a predetermined plan, the use of the previously employed frequency preparation processes (synthesizers) leads, as is known, to very heavy capital costs, as two separate synthesizers may be required, for example.

In the circuit arrangement shown in FIG. 2, this problem is overcome in a basically simple form.

The oscillator stage 4' is stabilized during a time interval Z1 (see FIG. 5), of 50 msec for example, by connection to the digital section II, which sets the stage 4' to the frequency $f1$, which is to be the operating frequency of a radio device during a time interval Z2 occurring after Z1 for a period of time of e.g. 50 msec. At the end of the time interval Z1, the oscillator stage 4' is disconnected from the digital section II by operation of the switches S1*a* and S2*b* so that the connection path from switch terminals S1*a* to S1*b* and the connection path from switch terminals S2*b* to S2*a* are opened. The oscillator stage 4' is now free running but is sufficiently accurate in terms of frequency for a certain period of time (short term stability), for the generation of the operating frequency $f1$ throughout the required time interval Z2. (In FIG. 2 via the switch S3 as the connection path from the switch terminals S3*a* to S3*b*). During the time in which the oscillator 4' is responsible for producing the radio device operating frequency $f1$, the time interval Z2, FIG. 5, the oscillator 4 is stabilized to a frequency $f2$ which is required in a following time interval Z3 (e.g., for 50 msec), and at the end of the time interval Z2 the stage 4 is disconnected from the digital section so that the digital section can then be reprogrammed for the preparation of a radio device frequency $f3$ on the oscillator stage 4', and at the beginning of the time interval Z3 the stage 4 is switched through to the output to the radio device, providing the required frequency $f2$. This process can be repeated as often as desired for the generation of any number of frequencies, the oscillator to be disconnected from the "digital section" always being the one which is currently participating in the generation of the radio device operating frequency. The times which lie between the time intervals Z1, Z2, Z3, etc., can either possess finite values, e.g., they may be 10 msec or more, or can be as infinitesimally short as practice will permit. This results in a further advantage.

As is known, the synthesizer technique involves considerable problems relating to subsidiary waves which are due to the fact that in the known circuits, the conventionally employed divider circuits and/or frequency converters serve to produce a plurality of frequencies which can lead to a parasitic modulation and thus to subsidiary waves via terminals A1 and A2 (FIG. 1) of the synchronization loop on the frequency stabilized oscillator 4. However, since the oscillator stage used for the generation of the operating frequency of the radio device at any instant is always cut off from the above mentioned interference sources while it is responsible for producing the radio device operating frequency, the use of the above circuit makes possible a considerable reduction in the expenditure on screening, in the circuits for effecting the frequency processing technique, and in the selections which are required at present in order to overcome the problems of subsidiary waves.

It is also advantageously possible to modify the principle in accordance with the invention to synchronize more than two oscillators and thus to simultaneously produce a plurality of quartz-crystal stabilized frequencies, obtained from a common digital section II.

Since the short term stability (e.g. <1 sec) which may be achieved in free running oscillators, assuming an appropriate selection of the time constant in the control circuit, is fully sufficient for the achieval of the frequency constancy required in any conventional communications device at least in the initial frequency ranges of the frequency generation, the above circuit can also be used to basically simplify the problems of subsidiary waves in synthesizers in analogue signal systems, and in particular carrier frequency signal transmission. The functions which the circuit must fulfill are in this case somewhat modified since small periods of time in which the radio device does not have any communications function cannot be easily realized with a rational outlay. Thus, in this case, the aim is to effect a switch-over in such manner that within a transmission band of say from 6 to 108 kHz, or from 300 Hz to 3.4 kHz, no interferences occur, thus e.g. a high value is obtained in the ratio of effective to interference phase range. Apart from making rapid frequency changes possibly the other problem solved by an arrangement constructed in accordance with the present invention is that of subsidiary wave suppression.

The oscillators 4 and 4′ can be alternately tuned to one single frequency $f0$ which serves to produce the radio device nominal frequency as described above. However, it is quite possible that despite the rhythmic phase stabilization of the oscillators 4 and 4′ to a reference signal, there will remain between these oscillators stages a few degrees of phase residual error, (not frequency difference). In this case, the above described instantaneous switch-over in the output change over switch S3 shown in FIG. 2 can give rise to a fault since it is then possible for interference bursts to occur in the transmission band, as a result of the phase jumps between each oscillator stage in the transmission system, in particular when phase or frequency modulation is used.

Figure 4:
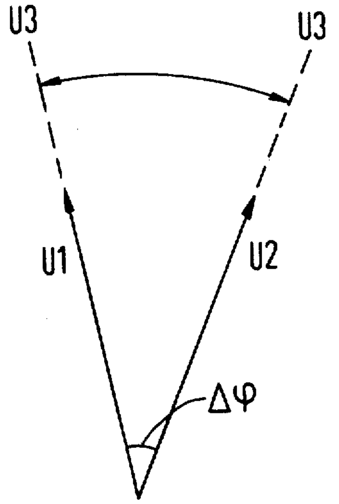
FIG. 4 is a graph illustrating the phase conditions of the output signal in a circuit arrangement as shown in FIG. 3, and FIGS. 5 and 6 are an explanatory set of timing diagrams for oscillator frequency stabilization and oscillator operation.

This difficulty can be avoided by employing the exemplary embodiment shown in FIG. 3, in which the digital section II and/or the frequency converter section which produces the subsidiary waves is no longer connected during the entire operating interval of an oscillator, but periods are provided in which both oscillators are disconnected from the digital section and are thus free of subsidiary waves. The change over switch 3 at the output of the embodiment shown in FIG. 2 is replaced by a potentiometer 7 which comprises an adder circuit by means of which the oscillator stages 4 and 4′ may be interconnected in such manner that when the control loop is operated the resultant signal U3 moves continually from the phase state of the voltage U1 to the phase stage of U2 (see FIG. 4), i.e., the possibility is thus provided of accurately predetermining the phase change speed and thus e.g. contriving it to be such that in FM radio relay systems, the signals associated with the phase change lie at low base band frequencies in the official call range (very large useful phase range e.g. of up to a few 1000 $\pi$) or below the base band frequency range (< 300 Hz).

This cicuit arrangement can be generally applied for filtering alternating voltages when the short term frequency constancy which may be achieved on the synchronized oscillators 4 and 4′ is sufficient to realize the set aim. The realization of the potentiometer function of the adder circuit 7 in FIG. 3 is dependent upon the operating frequency range. Circuits which realize this special function are known, for example, two transistors respectively connected to the separate oscillator stages and operating into a common load, the circuit being switchable to completely cut off the oscillator which is being currently frequency stabilized via the control loop from the output connection point 5, for isolating purposes, as the oscillator does not perform any requisite frequency generating function during this period. Thus, points T3 and T4 in FIG. 3 correspond in principle to the terminals S3*a* and S3*c* in FIG. 2.

Figure 5:
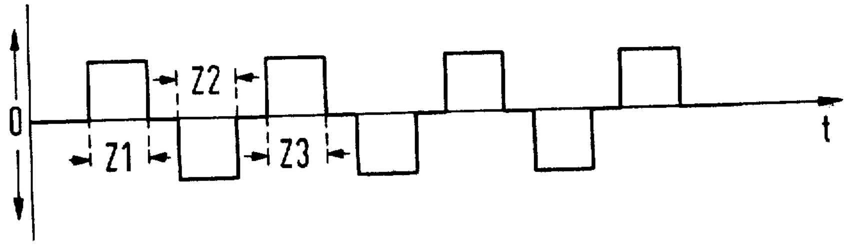
Figure 6:
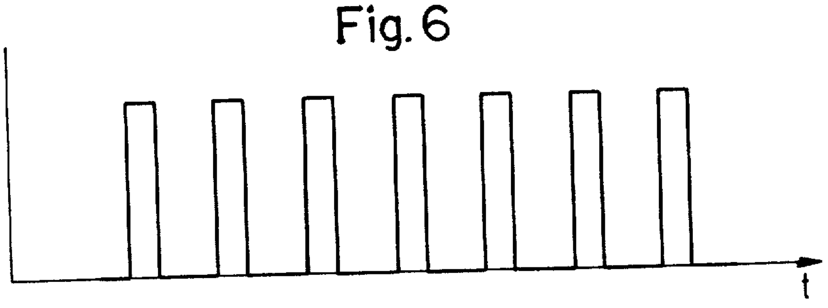

FIGS. 5 and 6 show a time plan for the oscillator frequency stabilization and the oscillator operation. In the upper line of FIG. 5, the time $t$ is plotted on the abscissa, while the connection period of the digital section II to the oscillator stage 4 is plotted on the part of the ordinate above the abscissa, and the connection period of the digital section II to the oscillator stage 4′ is plotted on the part of the ordinate below the abscissa. The line of FIG. 6 shows the transition intervals between the oscillator stages 4 and 4′ in dependence upon the time $t$ in coordination with the lines of FIG. 5 together with the programming times for the frequency divider or dividers 3 in the digital section II.

It will be apparent to those skilled in the art that many modifications and variations may be effected without departing from the spirit and scope of the novel concepts of the present invention.

I claim as my invention:

1. A stabilized oscillator circuit comprising two controlled oscillator stages, an output terminal, first switching means for periodically switching said output terminal from the output of one oscillator stage to the output of the other, each of said controlled oscillator stages being stable within predetermined limits for a given period when free running, a reference oscillator circuit, an adjustable frequency divider network, a phase discriminator having a first input connected to said reference oscillator, and having a second input connected to an output of said frequency divider network, second switching means for selectively connecting alternately one of said controlled oscillator stages into a loop between an output of said phase discriminator and an input of said frequency divider network, said first and second switching means being alternately operative to connect the output of one of said controlled oscillator stages while it is free-running to said output terminal and to connect the other controlled oscillator stage into said loop to be stabilized by said reference frequency oscillator.

2. A stabilized oscillator circuit according to claim 1, in which each of said controlled oscillator stages is a stage that possesses a high short-term frequency stability such that during the operating period its oscillating frequency is within a given tolerance range of its set frequency value for at least 10 msec of free-running operation.

3. A stabilized oscillator circuit according to claim 1, in which each said controlled oscillator stage is connected into said loop to effect any required frequency correction, and is disconnected therefrom before it has its output connected to said output terminal, so that it operates without the frequency stabilization circuit at least for a part of its active period.

4. A stabilized oscillator circuit according to claim 1, in which said reference oscillator circuit comprises a crystal controlled oscillator.

5. A stabilized oscillator circuit having an output terminal and comprising two controlled oscillator stages, switching means for periodically connecting an output of first one and then the other of said controlled oscillator stages to said output terminal, each of said controlled oscillator stages being stable within predetermined limits for a given period when free-running, a reference oscillator circuit, means for stabilizing said other one of said controlled oscillator stages from said reference oscillator circuit for a terminal part of the time that said one of said controlled oscillator stages is connected to said output terminal, means for stabilizing said one of said controlled oscillator stages from said reference oscillator circuit for a terminal part of the time that said other one of said controlled oscillator stage is connected to said output terminal, said stabilizing means including a phase discriminator for comparing the output frequency of the reference oscillator with a frequency component of the output of a respective one of said controlled oscillator stages and for providing a control signal to said respective one of said controlled oscillator stages.

6. A stabilized oscillator circuit comprising two control oscillators, switching means for alternately switching said control oscillators into a phase lock loop, an output terminal, means for alternately connecting said control oscillators to said output terminal during a free-running period of each oscillator, said phase lock loop including a reference oscillator and means for comparing the reference oscillator frequency with the frequency of one of said control oscillators, each said control oscillator being free-running during the period when such oscillator is connected to the output terminal.

7. A stabilized oscillator circuit comprising two controllable oscillator stages operating at the same frequency, an output circuit, a reference oscillator having a stabilized reference frequency, a frequency divider circuit, switch means for alternately connecting an output of first one and then the other of said controllable oscillator stages to said output circuit and for alternately connecting an output of first said other and then said one ofsaid controllable oscillator stages to said frequency divider circuit, a phase discriminator circuit to which said reference oscillator and said frequency divider circuit are connected, means to stabilize each said controllable oscillator stage from the output of said phase discriminator during the time that said controllable oscillator stage is connected to said frequency divider circuit, said switching means which connects first one and then the other of said controllable oscillator stages to said output circuit being such as to cause a transition from one controllable oscillator stage to the other to take place so slowly that any interference phase modulation produced by the transition process remains below a predetermined value, both controllable oscillator stages being disconnected from the phase discriminator circuit during the transition period.

* * * * *